United States Patent [19]

Scifres et al.

[11] 4,317,086
[45] Feb. 23, 1982

[54] PASSIVATION AND REFLECTOR STRUCTURE FOR ELECTROLUMINESCENT DEVICES

[75] Inventors: Donald R. Scifres, Los Altos; Neville Connell, Cupertino; William Streifer, Palo Alto, all of Calif.

[73] Assignee: Xerox Corporation, Stamford, Conn.

[21] Appl. No.: 75,383

[22] Filed: Sep. 13, 1979

[51] Int. Cl.³ .............................................. H01S 3/19
[52] U.S. Cl. ...................................... 372/49; 357/17; 357/52
[58] Field of Search .................... 331/94.5 H; 357/17, 357/18, 52; 350/164

[56] References Cited

U.S. PATENT DOCUMENTS

| | | | |
|---|---|---|---|
| 3,849,738 | 11/1974 | Hakki | 331/94.5 H |
| 3,914,465 | 10/1975 | Dyment et al. | 357/52 X |
| 3,943,462 | 3/1976 | Thompson | 331/94.5 H |
| 4,001,719 | 1/1977 | Krupka | 331/94.5 H |
| 4,092,659 | 5/1978 | Ettenberg | 357/18 |
| 4,095,011 | 6/1978 | Hawrylo et al. | 357/52 X |
| 4,100,508 | 7/1978 | Wittke | 331/94.5 H |
| 4,147,409 | 4/1979 | Apfel | 331/94.5 C X |
| 4,178,564 | 12/1979 | Ladany et al. | 331/94.5 H |

OTHER PUBLICATIONS

Furuse et al., "Insulating Carbon Coating on (AlGa)As DH Laser Facets", *Appl. Phys. Lett.*, 33(4), Aug. 15, 1978, pp. 317-318.

*Primary Examiner*—James W. Davie
*Attorney, Agent, or Firm*—W. Douglas Carothers, Jr.

[57] ABSTRACT

A passivation layer of perylene and its incorporation in three layer reflector structure deposited on the light emitting surface of a semiconductor electroluminescent device is disclosed. The reflector structure comprises a layer of low refractive index material, a layer of high refractive index material and a layer of low refractive index material. Preferably the index of refraction for the high refractive index layer is in excess of 3.5 and the materials for this layer may be antimony, bismuth, tellurium, selenium, germanium, arsenic, sulfur, and admixtures thereof. Admixtures may include chemically di-ordered crystalline or amorphous alloys of selenium, tellurium, arsenic and germanium. Examples of low index materials are $Al_2O_3$, $MgF_2$, $SiO_2$, $ZnO_2$ or perylene.

4 Claims, 3 Drawing Figures

PASSIVATION AND REFLECTOR STRUCTURE FOR ELECTROLUMINESCENT DEVICES

BACKGROUND OF THE INVENTION

The present invention relates to reflector structures as applied to at least one light emitting surface of semiconductor electroluminescent devices, such as, injection lasers or light emitting diodes (LEDs).

Heretofore, the suggestion has been made to apply multilayered structures to at least one facet surface of an electroluminescent device to provide a high level of reflectivity. If the reflectivity level is high at one of the facet surfaces, the current threshold of the device is reduced because more of the optical radiation is reflected back into optical radiation cavity of the device. Such multilayered reflector structures are disclosed in U.S. Pat. Nos. 4,092,659 and 4,147,409.

The prior art multilayered reflector structures require several layers of materials to provide high levels of reflectivity. For example, U.S. Pat. No. 4,092,659 discloses a stack reflector that requires four contiguous layers to provide a high level of reflectivity.

What is proposed here is a three layer reflector that will provide a reflector structure that has relatively high modal reflectivity.

SUMMARY OF THE INVENTION

In accordance with the present invention a passivation layer of perylene and its incorporation in a multilayered reflector of a minimum of three layers of material consecutively deposited on at least one light emitting surface of a semiconductor electroluminescent device is disclosed. Perylene has desirable optical and encapsulation properties for protecting the device from degradation due to the ambient environment while having good optical transparency. Perylene may also be used in a reflector structure which comprising a layer of low index material, a layer of relatively high index dielectric material and a protective layer of low index material, providing an overall level of reflectivity of about 70 to 85%. Such high levels of reflectivity have not been previously attainable with such dielectric reflectors unless fabricated to include more than three deposited layers of material.

Other objects and attainments together with a fuller understanding of the invention will become apparent and appreciated by referring to the following description and claims taken in conjunction with the accompanying drawing.

DETAILED DESCRIPTION OF THE INVENTION

Figure 1:
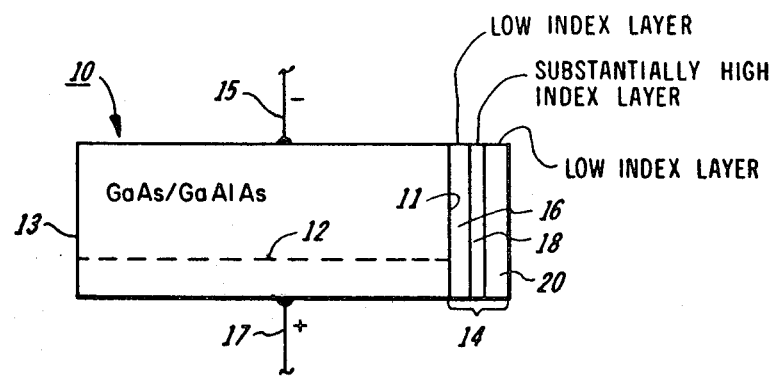
FIG. 1 is a side elevation of a semiconductor injection laser with a three layered reflector structure comprising this invention.
Figure 2:
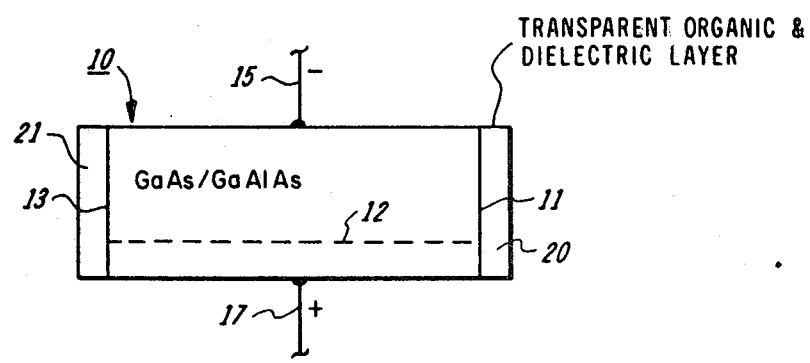
FIG. 2 is a side elevation of a semiconductor injection laser with protective coatings on its facet surfaces.

Referring to FIGS. 1 and 2, a semiconductor electroluminescent device in the form of an injection GaAs/-GaAlAs laser 10 is shown. Laser 10 is provided with conventional mirror facet surfaces 11 and 13 that function as partial reflectors so that optical radiation may be reflected back into the optical cavity 12 of the laser 10 and propagate therein.

Laser 10 is provided with conventional terminals 15 and 17 for establishing a current flow through the laser and establishing a bias at its p-n junction to cause population inversion and carrier recombination, as is well known in the art.

A multilayer dielectric structure 14 is deposted on the rear facet surface 11 of the laser 10. The structure consecutively comprises a low refractive index layer 16, a relatively high refractive index layer 18 and an outer low refractive index layer 20. These layers are sequentially deposited by conventional vapor deposition processes.

The material for the low index layers 16 and 20 may be selected from the group consisting of $Al_2O_3$, $MgF_2$, $SiO_2$ and $ZrO_2$. The material for the high index layer 18 is selected to have a high index of refraction preferably in excess of 3.5 and may have a high absorption capacity for optical radiation at the emitted wavelength of the laser 10. The materials may generally be the same as those used for optical recording media. Such materials include antimony, bismuth, tellurium, selenium, germanium, arsenic, sulfur, and admixtures thereof. These materials all have indices in excess of 3.5 Such admixtures may include chemically disordered crystalline or amorphous alloys of selenium, tellurium, arsenic and germanium. $Te_{70}SeAs_{15}$ is an example.

Another material for low index layers 16 and 20 is perylene, which is chemically dinaphthylene. The index of refraction of perylene is about 1.5. This material is dielectric, has good optical and heat insulating properties and is impervious to water or water vapor. The employment of perylene as the material for layer 16 seals the laser facet 11 from moisture and water vapor as well as oxidations.

Because of the above mentioned properties, perylene is a very suitable material for facet encapsulation of injection lasers. The employment of a perylene layer on facets 11 and 13 prevents subsequent facet degradation due to oxidation and the presence of water vapor.

As shown in FIG. 2, laser 10 has layers 20 and 21 of perylene vapor deposited, respectively, on facet surfaces 11 and 13. These layers seal the facet surfaces 11 and 13 and from such environmental degradation.

Figure 3:
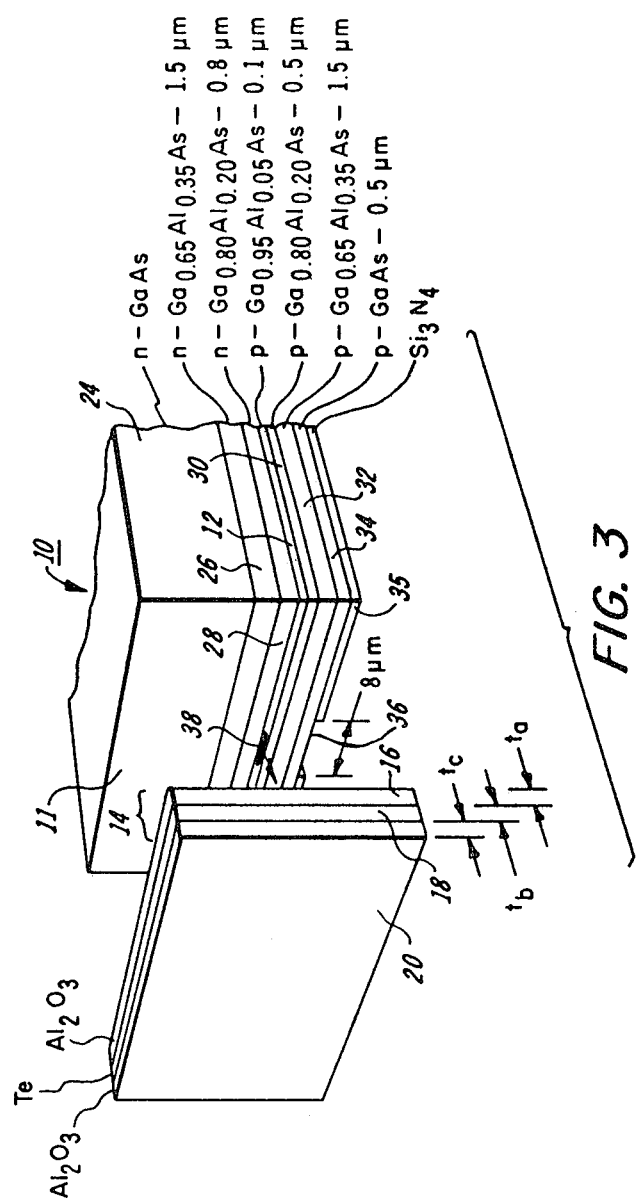
FIG. 3 is a perspective exploded view of a semiconductor injection laser with a deposited multilayered reflector structure of the present invention.

A specific illustration and actual example of the laser 10 and multilayered structure 14 is shown in FIG. 3. The large optical cavity (LOC) laser 10 comprises a substrate 24 of n type GaAs; a layer 26 of n type $Ga_{0.65}Al_{0.35}As$, an optical confinement layer 28 of n type $Ga_{0.80}Al_{0.20}As$, an optical confinement layer 30 of p type $Ga_{0.80}Al_{0.20}As$, a layer 32 of p type $Ga_{0.65}Al_{0.35}As$ and a contact layer 34 of p type GaAs. Layer thicknesses are illustrated in FIG. 3. Optical radiation is emitted from active layer 12 at point 38 in facet surface 11.

LOC laser 10 has an 8 μm wide contact stripe 36 as defined by the etched silicon nitride layer 35. The length of laser 10 may be typically 175 to 200 μm long.

The laser 10 is mounted p-side down on a header (not shown) and positioned in an electron gun vacuum deposition system for fabrication of the multilayered mirror structure 14.

The laser 10 is placed in a vacuum deposition system with its terminals 15 and 17 connected to a current pulse generator having, for example, a 500 nsec pulse width, so that the laser can be operated during the deposition process of structure 14. Optical output from the front facet surface 13 may be monitored by a calibrated photodiode.

As shown in FIG. 3, the fabricated dielectric stack consists of $Al_2O_3/Te/Al_2O_3$ which are consecutively vapor deposited layers 16, 18, and 20.

The actual deposition process proceeds as follows. First, an $Al_2O_3$ film 16 with a thickness, $t_a$, of approximately 1200 A is deposited. This is followed by deposition of a Te film 18 of thickness, $t_b$, of approximately 300 A. With estimated refractive indices at approximately 1.7 and 6.0 respectively, these layer thicknesses approximately correspond to quarter wave films at 8500 A. Next, a 2400 A $Al_2O_3$ film 20 is deposited which is half wavelength thickness.

The primary function of the outer lower index layer 20 is to protect the Te layer 18 from oxidation. Because of the high index of refraction of the Te layer, substantially all the reflection occurs at the layer 16-18 interface. For this particular example, the level of reflectivity at this interface is about 70%.

The thickness of the Te is not critical. Its thickness should not be too large so that its optical absorbant properties are deleterious to the overall functioning of the reflector structure 14.

The following two examples illustrate the reflectivity of the three layers, dielectric reflector 14 where layers 16 and 18 each have thicknesses equal to $\lambda/4$ and layer 20 is of different thicknesses and the free space operating wavelength is 8500 A for LOC laser 10. In this case, the effective index for laser 10 is 3.5. Layer 16 is $Al_2O_3$ and has a thickness, $t_a$, equal to 0.125 $\mu$m ($\lambda/4$) with n=1.7. Layer 18 is Te with a thickness equal to 0.0343 $\mu$m ($\lambda/4$) and an index of reflection having a real portion equal to 6.2 plus an imaginary portion equal to 1.5. Layer 20 is $Al_2O_3$ with n=1.7. For variable thicknesses of $t_c$, the results of reflectivity are shown in Table I.

TABLE I

| thickness, $t_c$ ($\mu$m) | % reflectivity |
| --- | --- |
| 0.125 ($\lambda/4$) | 71.0 |
| 0.150 | 71.2 |
| 0.175 | 73.4 |
| 0.200 | 75.7 |
| 0.225 | 77.4 |
| 0.250 ($\lambda/2$) | 78.5 |

If perylene is substituted for the $Al_2O_3$ in both layers 16 and 20 and the thickness, $t_a$, of layer 16 is equal to 0.1417 $\mu$m ($\lambda/4$) where the index of refraction of perylene is about 1.5, the results of reflectivity for different thicknesses, $t_c$, are shown in Table II.

TABLE II

| thickness, $t_c$ ($\mu$m) | % reflectivity |
| --- | --- |
| 0.1134 | 79.5 |
| 0.1417 ($\lambda/4$) | 78.0 |
| 0.1700 | 78.3 |
| 0.1984 | 79.8 |
| 0.2267 | 81.3 |
| 0.2551 | 82.3 |
| 0.2834 ($\lambda/2$) | 82.9 |

Although Te has an absorbtion capacity for the optical radiation emitted from cavity 12, which absorbtion capacity is about 15%, the reflectivity of the structure 14 is still sufficiently high, such as 70% or greater.

Perylene or similar organic material may be substituted for both layers 16 and 20 and provide the same reflecting and encapsulating properties as the structures shown in FIGS. 1 and 3. As is recognized by those skilled in this art, laser 10 is not limited to GaAs/GaAlAs lasers. For example, a InP/InGaAsP laser may be substituted for previously described structures of laser 10.

While the invention has been described in conjunction with specific embodiments, it is evident that any alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. In a semiconductor electroluminescent device having a p-n junction in the device capable of emitting optical radiation when made operative by means of a current applied across said junction, the emission of the radiation from said device being from at least one facet surface thereof and characterized by
   a passivation layer of organic perylene encapsulating at least said one facet surface, said perylene having high optical transparency and impervious to the ambient environment.

2. In the semiconductor electroluminescent device of claim 1 wherein a layer of a high index material selected from the group consisting of antimony, tellurium, selenium, arsenic, germanium and sulfur and admixtures thereof is deposited on said passivation layer followed by an outer layer of low refractive index material selected from the group consisting of $Al_2O_3$, $MgF_2$, $SiO_2$, $ZnO_2$ and perylene deposited on said high index layer.

3. In the semiconductor electroluminescent device according to claim 1 or 2, said device comprising a semiconductor injection laser.

4. In the semiconductor electroluminescent device of claim 1 wherein said device comprises a semiconductor injection laser having two facet surfaces for the emission of radiation, both of said surfaces encapsulated with a passivation layer of organic perylene.

* * * * *